(12) United States Patent
Benveniste

(10) Patent No.: US 6,677,598 B1
(45) Date of Patent: Jan. 13, 2004

(54) BEAM UNIFORMITY AND ANGULAR DISTRIBUTION MEASUREMENT SYSTEM

(75) Inventor: Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/425,924

(22) Filed: Apr. 29, 2003

(51) Int. Cl.$^7$ ............................................. H01J 37/317
(52) U.S. Cl. .................... 250/492.21; 250/397
(58) Field of Search ............................ 250/492.21, 397, 250/398

(56) References Cited

U.S. PATENT DOCUMENTS 5,132,545 A * 7/1992 Shono et al. .......... 250/492.21
5,198,676 A 3/1993 Benveniste et al.

* cited by examiner

Primary Examiner—Kiet T. Nguyen
(74) Attorney, Agent, or Firm—Eschweiler & Associates, LLC

(57) ABSTRACT

The present invention facilitates semiconductor device fabrication by monitoring uniformity of beam current and angle of incidence at various locations throughout an ion beam (e.g., a wider portion of a ribbon beam). One or more uniformity detectors are employed within an ion implantation system (e.g., single wafer based system and/or a multiple wafer based system) and are comprised of a number of elements. The respective elements comprise an aperture that selectively obtains a beamlet from an incident ion beam and a pair of sensors that measure beam current as a function of the incoming angle of the ion beam. The angle of incidence at for particular elements can be determined at least partially from the measured beam current by the pairs of sensors. As a result, generation of an ion beam can be adjusted to improve uniformity as indicated and ion implantation can be performed with an improved uniformity and under tighter process controls.

22 Claims, 15 Drawing Sheets

BEAM UNIFORMITY AND ANGULAR DISTRIBUTION MEASUREMENT SYSTEM

FIELD OF INVENTION

The present invention relates generally to ion implantation devices, and, more particularly, to an ion beam uniformity and angular distribution measurement systems and methods.

BACKGROUND OF THE INVENTION

Ion implantation is a physical process, as opposed to diffusion, which is a chemical process, that is employed in semiconductor device fabrication to selectively implant dopant into semiconductor and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a wafer. The dopant ions physically bombard the wafer, enter the surface and come to rest below the surface.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system, referred to as a linear accelerator, is employed in some instances to accelerate or decelerate the desired dopant ions to a predetermined momentum (e.g., mass of an dopant ion multiplied by its velocity) to penetrate the wafer surface. For acceleration, the system is generally of a linear design with annular powered electrodes and pairs of quadruple lenses along its axis. The quadruple lenses are powered by negative and positive electrical potentials. As the dopant ions enter therein, they are accelerated therethrough by the powered electrodes and are (as a beam) selectively focused and defocused by the quadruple lenses.

Continuing on, the dopant ions are directed towards a target wafer at an end station. The dopant ions, as a beam, impact the wafer with a specific beam current. In order to obtain a substantially uniform dose distribution at the target, the beam is required to be substantially uniform and an angle of incidence of the beam is also required to be substantially uniform. Accordingly, suitable systems and methods for measuring beam uniformity and angular distribution are desirable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by monitoring uniformity of beam current and angle of incidence at various locations throughout an ion beam (e.g., a wider portion of a ribbon beam). One or more uniformity detectors are employed within an ion implantation system (e.g., single wafer based system and/or a multiple wafer based system). The detector(s) are operative to provide uniformity measurements before ion implantation (e.g., calibration), during ion implantation (e.g., in situ), and/or after ion implantation (e.g., verification). Based on the uniformity measurements, generation of an ion beam can be adjusted to improve uniformity as indicated. As a result, ion implantation can be performed with an improved uniformity and under tighter process controls.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
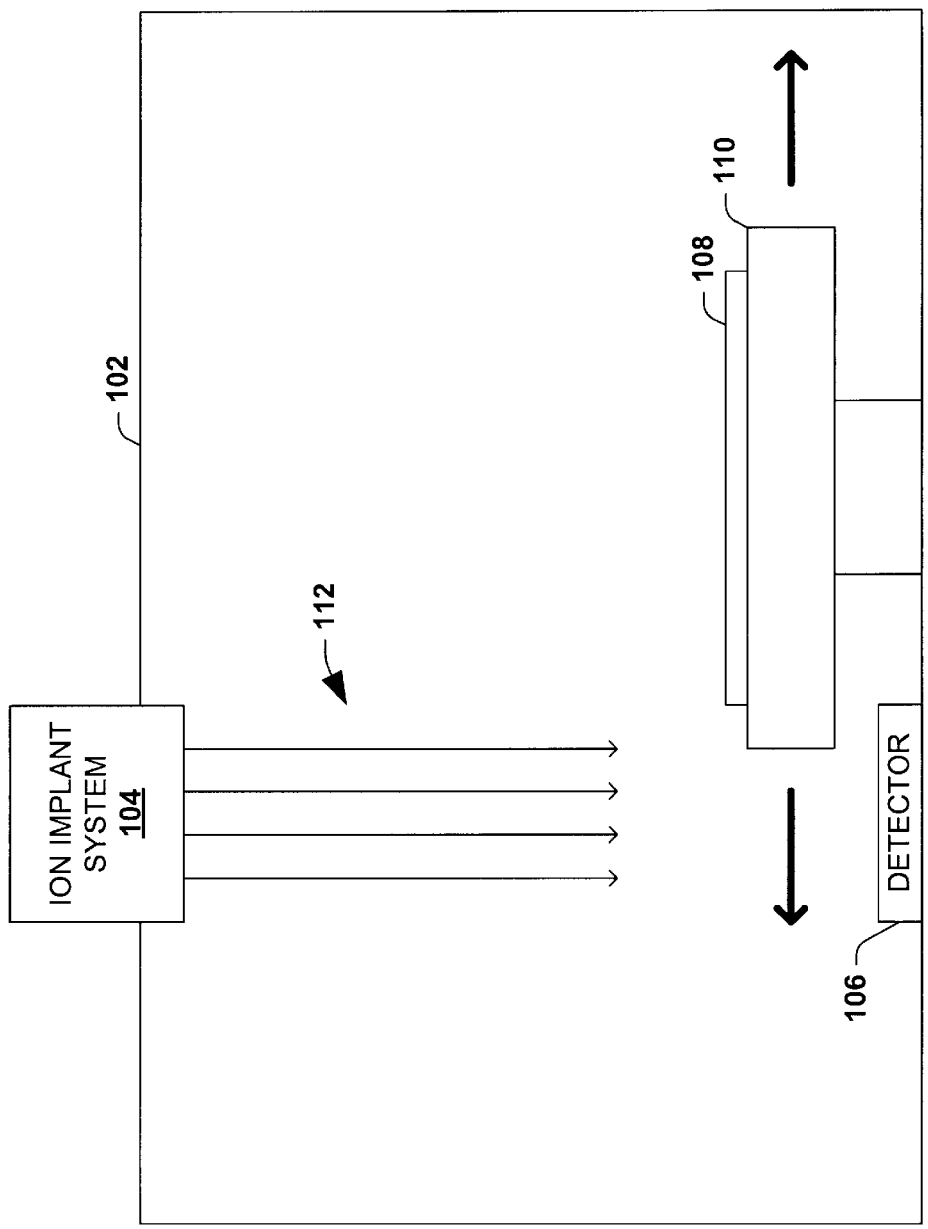
FIG. 1 is a block diagram illustrating a single wafer ion implantation system in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

The present invention facilitates semiconductor device fabrication by monitoring uniformity of beam current and angle of incidence at various locations throughout an ion beam (e.g., a wider portion of a ribbon beam). One or more uniformity detectors are employed within an ion implantation system (e.g., single wafer based system and/or a multiple wafer based system). The detector(s) are operative to provide uniformity measurements before ion implantation (e.g., calibration), during ion implantation (e.g., in situ), or after ion implantation (e.g., verification). Based on the uniformity measurements, generation of an ion beam can be adjusted to improve uniformity as indicated. As a result, ion implantation can be performed with an improved uniformity and under tighter process controls.

A uniformity detector is employed to obtain beam current and angle of incidence measurements and is comprised of one or more layers that each include a series or number of measuring elements. The respective layers can obtain angle of incidence measurements in a selected direction. The respective elements are operative to obtain an angle of incidence and/or a beam current measurement(s) for an incoming ion beam.

Beginning with FIG. 1, a block diagram of a simplified exemplary single wafer ion implantation system 100 in accordance with an aspect of the present invention is illustrated. The system 100 includes a chamber 102, an ion implantation system 104 including a source, a uniformity detector 106, and a module 110, also referred to as a pedestal or end station, that holds a single wafer 108. The system 100 depicted in FIG. 1 is provided for illustrative purposes and is not intended to include all aspects, components, and features of an ion implantation system. Instead, the system 100 is depicted so as to facilitate a further understanding of the present invention.

The ion implantation system 104 generates an ion beam 112, typically a ribbon beam, having a number of characteristics including, dopant type, dose, beam current, angle of incidence, energy, and the like. Although the ion beam 112 is depicted as being substantially orthogonal to a surface of the wafer 108, the ion beam 112 can be at other incident angles with the surface of the wafer 108 (e.g., >0, where 0 is a beam perpendicular to the surface).

As stated above, the module 110 holds the wafer 108. Additionally, the module 110 is operable to move the wafer (as indicated) through the ion beam 112 at a controlled rate so as to achieve desired implantation results. Generally, a given ion implantation is performed in a single pass of the wafer 108 through the ion beam 112. By so doing, a substantially uniform implantation across the wafer 108 can be obtained because all parts or portions of the wafer 108 move through the ion beam 112 at about the same rate. In contrast, other ion implantation systems employ a process disk that may also incorporate the present invention.

The uniformity detector 106 in the present example is positioned below the module 110 and in-line with the ion beam 112. The detector 106 is shown in a stationary position. It is appreciated that alternate aspects of the invention include any suitable number of detectors, detectors located at other positions, and movable detectors. For example, the detector 106 may be integrated on to the module or pedestal 110 and be in substantially the same plane as the wafer 108. The detector 106 measures uniformity of beam current across the ion beam 112 at a number of locations. Additionally, the detector 106 obtains angle of incidence measurements of the ion beam 112 at a number of locations. The beam current uniformity and angle of incidence measurements can be employed to modify the ion beam 112 generated by the ion implantation system 104 so as to improve uniformity. Additionally, these measurements can be used to indicate damage to wafers when the measurements depict substantial deviations.

The detector 106 includes a series of elements that respectively include an aperture and a pair of beam current sensors. The aperture permits only a portion of the ion beam 112, referred to as a beamlet, to pass through to the pair of beam current sensors. Beam current measured by each of the sensors is employed to indicate an angle of incidence of the beamlet and, therefore, a portion of the ion beam 112. Accordingly, each of the elements can be utilized to obtain an angle of incidence measurement and the measurements of the elements can then be used to determine uniformity of the angle of incidence throughout the ion beam 112. Further details and examples of suitable detectors in accordance with the present invention are described infra.

Figure 2:
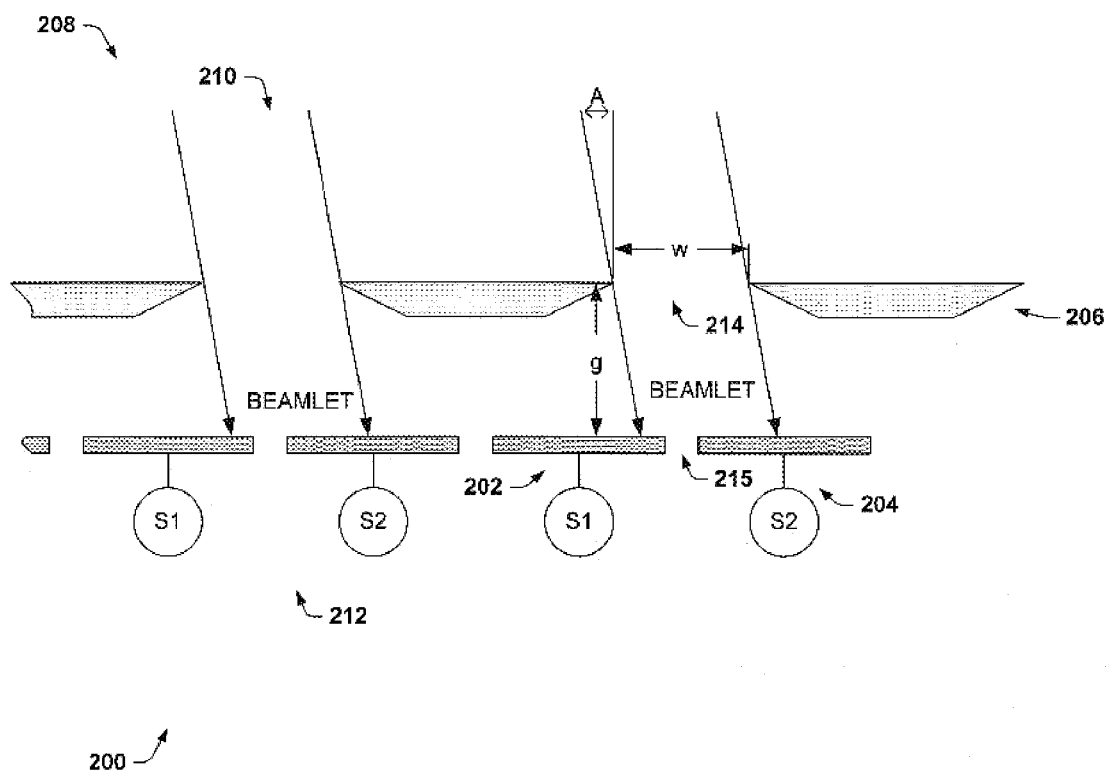
FIG. 2 is a diagram illustrating a portion of a uniformity detector in accordance with an aspect of the present invention.

Turning now to FIG. 2, a diagram of a portion of a uniformity detector 200 in accordance with an aspect of the present invention is illustrated. The detector 200 is comprised of a mask 206 and a series of sensor pairs 212 (S1 and S2), defining a number of elements, which are operable to obtain angle of incidence measurements in a first direction and beam uniformity measurements. The uniformity detector 200 can obtain these uniformity measurements at various portions of an ion beam 208 so as to indicate uniformity of the ion beam with respect to beam current and angle of incidence.

Individual elements are comprised of an aperture 214, a first beam current sensor 202, and a second beam current sensor 204. The aperture 214 is defined by the mask 206 and obtains a beamlet 210 from the ion beam 208 according to a width w of the aperture 214. The first beam current sensor 202 and the second beam current sensor 204 are positioned symmetrically below the aperture 214 a distance g and are separated from each other by a gap 215. The sensors (202 and 204) obtain beam current measurements (first and second measurements) from the beamlet 210. Because of their positioning, the first sensor 202 and the second sensor 204 measure different amounts of beam current depending on the angle of incidence of the beamlet 210 and the ion beam 208. As an example, the beamlet 210 depicted in FIG.

2 would yield a greater measured beam current by the second sensor 204 as compared with the first sensor 202. It is noted that if the angle of incidence A is about zero (e.g., a beam substantially perpendicular to the detector), the measured beam current of the sensors (202 and 204) is about equal.

The angle of incidence A of the beamlet 210 is a function of the first measurement and the second measurement. A suitable formula that can be used in accordance with the present invention to determine the angle of incidence A is as follows:

$$A=((S1-S2)/(S1+S2))*w/2g \quad \text{(Eq. 1)}$$

where A is the angle of incidence, S1 is the first measured beam current, S2 is the second measured beam current, w is the width of the aperture, and g is the distance the sensors are located below the mask 206 or aperture 214. Other suitable formulas can be employed to obtain the angle of incidence and/or an indication of the angle of incidence and still be in accordance with the present invention. Furthermore, the first measured beam current and the second measured beam current can be added together (S1+S2) to provide an indication of beam current at the element.

Angle of incidence measurements from the number of elements are analyzed to determine uniformity of the angle of incidence of the ion beam throughout the beam. Additionally, beam current measurements from the number of elements can be analyzed to determine uniformity of the beam current throughout the ion beam. Based on these measurements, corrective actions can be taken to improve uniformity of the ion beam 208.

Figure 3:
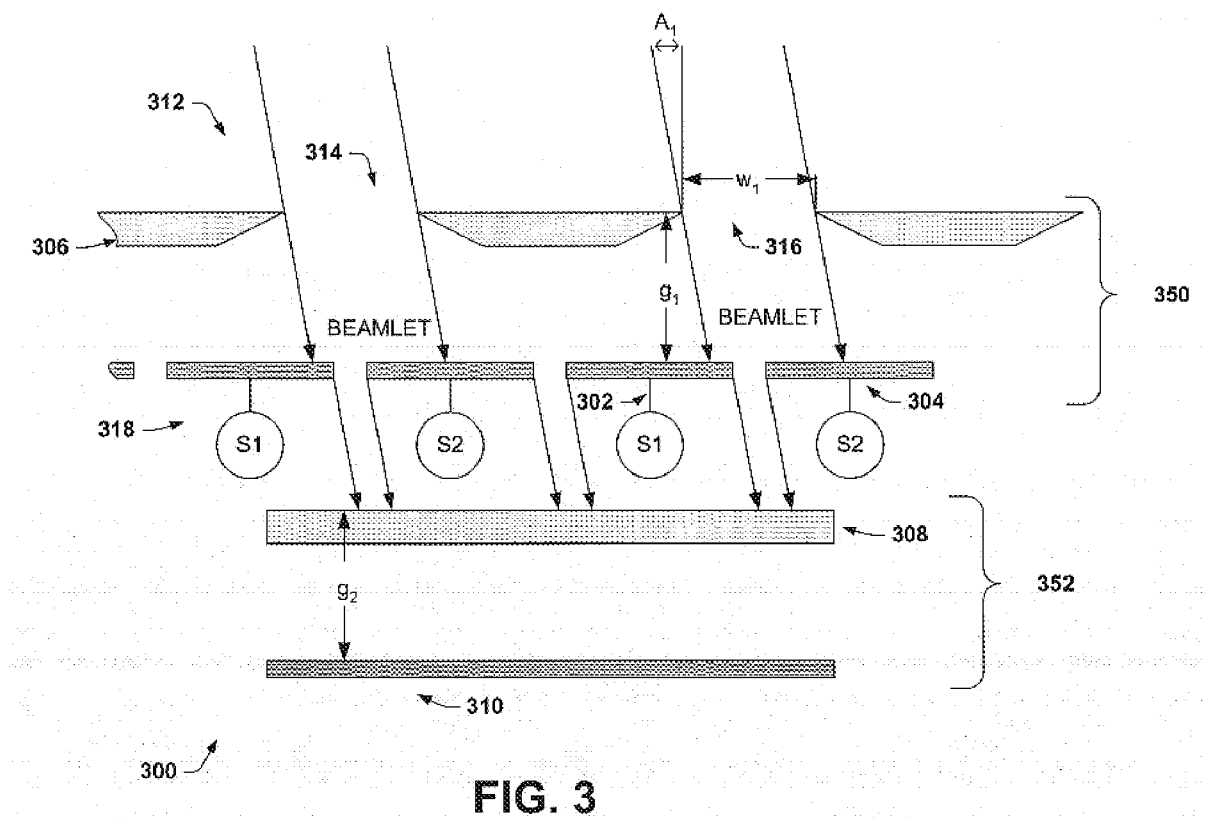
FIG. 3 is a diagram illustrating a portion of a uniformity detector in accordance with an aspect of the present invention.

FIG. 3 is a diagram that illustrates a portion of a uniformity detector 300 in accordance with an aspect of the present invention. The detector 300 is comprised of a first layer 350 that obtains beam current and angle of incidence measurements in a first direction and a second layer 352 that obtain beam current and angle of incidence measurements in a second direction that is orthogonal to the first direction. The first layer 350 is comprised of a mask 306 and a series of sensor pairs 318, defining a number of elements, which are operable to obtain angle of incidence measurements and beam uniformity measurements. The second layer 352 is also comprised of a mask 308 and a series of sensor pairs 310 and is arranged orthogonal to and below the first layer 350. The uniformity detector 300 can obtain these uniformity measurements at various portions and both directions (e.g., "x" and "y") of an ion beam 312 so as to indicate uniformity of the ion beam with respect to beam current and angle of incidence.

Individual elements of the first layer 350 are comprised of an aperture 316, a first beam current sensor 302, and a second beam current sensor 304. The aperture 314 is defined by the mask 306 and obtains a beamlet 314 from the ion beam 312 according to a width $w_1$. The first beam current sensor 302 and the second beam current sensor 304 are positioned symmetrically below the aperture 314 a distance $g_1$. The sensors (302 and 304) obtain beam current measurements (first and second measurements) from the beamlet 314. As described supra, the first sensor 302 and the second sensor 304 measure different amounts of beam current depending on the angle of incidence of the beamlet 314 and the ion beam 312 in the first direction because of their positioning. From these measurements, an angle of incidence $A_1$ can be determined for the first direction (e.g., the first direction extending along the length of a ribbon beam).

Individual elements of the second layer 352 are also comprised of an aperture (not shown) defined within the mask 308 and a first beam sensor and a second beam sensor (not shown) defined within the series of sensor pairs 310. Likewise, the first beam current sensor and the second beam current sensor are positioned symmetrically below the aperture with a distance $g_2$. The sensors obtain beam current measurements (first and second measurements) from a portion of the beamlet 314 defined by the aperture width $w_2$ (not shown). The first sensor and the second sensor measure first and second beam currents that vary with respect to each other on the angle of incidence of the ion beam 312 in the second direction. From these second layer 352 measurements, an angle of incidence $A_2$ can be determined for the second direction (e.g., the second directing extending along a width of a ribbon beam).

Collectively, the elements of the first layer 350 indicate angular uniformity throughout the ion beam 312 in the first direction and the elements of the second layer 352 indicate angular uniformity throughout the ion beam 312 in the second direction. Furthermore, the elements of both layers are operable to provide beam current measurements (e.g., a sum of beam current measured by a sensor pair) to indicate beam current uniformity or lack thereof throughout the ion beam 312. Based on the detected uniformity or lack thereof, the ion beam 312 can be adjusted and/or corrected so as to improve uniformity.

Figure 4:
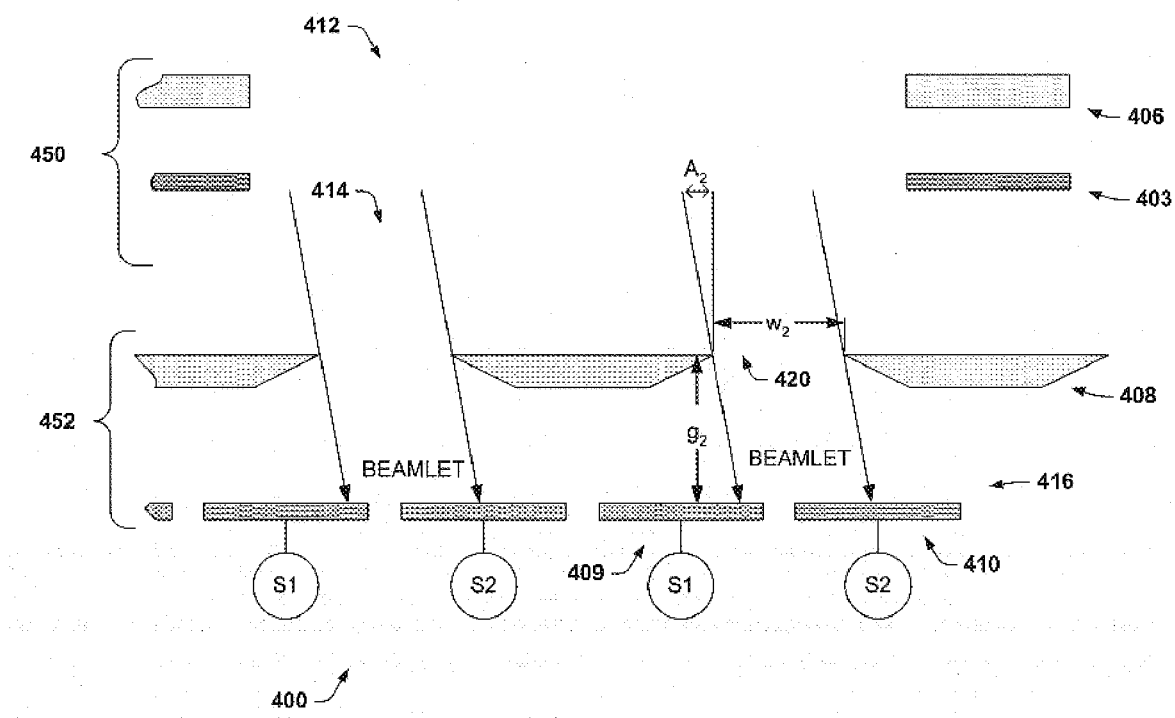
FIG. 4 is a diagram illustrating a portion of a uniformity detector in accordance with an aspect of the present invention.

FIG. 4 is a diagram/view that illustrates another portion of a uniformity detector 400 in accordance with an aspect of the present invention. This view is orthogonal to the view depicted in FIG. 3. The detector 400 is comprised of a first layer 450 that obtains beam current and angle of incidence measurements in a first direction and a second layer 452 that obtain beam current and angle of incidence measurements in a second direction that is orthogonal to the first direction. The first layer 450 is comprised of a mask 406 and a series of sensor pairs 403, defining a number of elements, which are operable to obtain angle of incidence measurements and beam uniformity measurements. The second layer 452 is also comprised of a mask 408 and a series of sensor pairs 416 and is arranged orthogonal to and below the first layer 450. The uniformity detector 400 can obtain these uniformity measurements at various portions and both directions of an ion beam 412 so as to indicate uniformity of the ion beam with respect to beam current and angle of incidence.

Individual elements of the first layer 450 are comprised of an aperture (not shown), a first beam current sensor (not shown), and a second beam current sensor (not shown). The aperture is defined by the mask 406 and obtains a beamlet from the ion beam 412 according to a width $w_1$. The first beam current sensor and the second beam current sensor are positioned symmetrically below the aperture a distance $g_1$. The sensors obtain beam current measurements (first and second measurements) from the beamlet. Because of their positioning, the first sensor and the second sensor measure different amounts of beam current depending on the angle of incidence of the beamlet and the ion beam 412 in the first direction. From these measurements, an angle of incidence $A_1$ can be determined for the first direction.

Individual elements of the second layer 452 are also comprised of an aperture 420 defined within the mask 408 and a first beam sensor 409 and a second beam sensor 410 defined within the series of sensor pairs 410. Likewise, the first beam current sensor and the second beam current sensor are positioned symmetrically below the aperture with a distance $g_2$. The sensors obtain beam current measurements (first and second measurements) from a portion of the beamlet 414 defined by the aperture width $w_2$. The first sensor 409 and the second sensor 410 measure first and second beam currents that vary with respect to each other on the angle of incidence of the ion beam 412 in the second direction. From these second layer 452 measurements, an angle of incidence $A_2$ can be determined for the second direction.

As with the uniformity detector 300 of FIG. 3, the elements of the first layer 450 indicate angular uniformity throughout the ion beam 412 in the first direction and the elements of the second layer 452 indicate angular uniformity throughout the ion beam 412 in the second direction. Furthermore, the elements of both layers are operable to provide beam current measurements (e.g., a sum of beam current measured by a sensor pair) to indicate beam current uniformity or lack thereof throughout the ion beam 412. Based on the detected uniformity or lack thereof, the ion beam 412 can be adjusted and/or corrected so as to improve uniformity.

Figure 5:
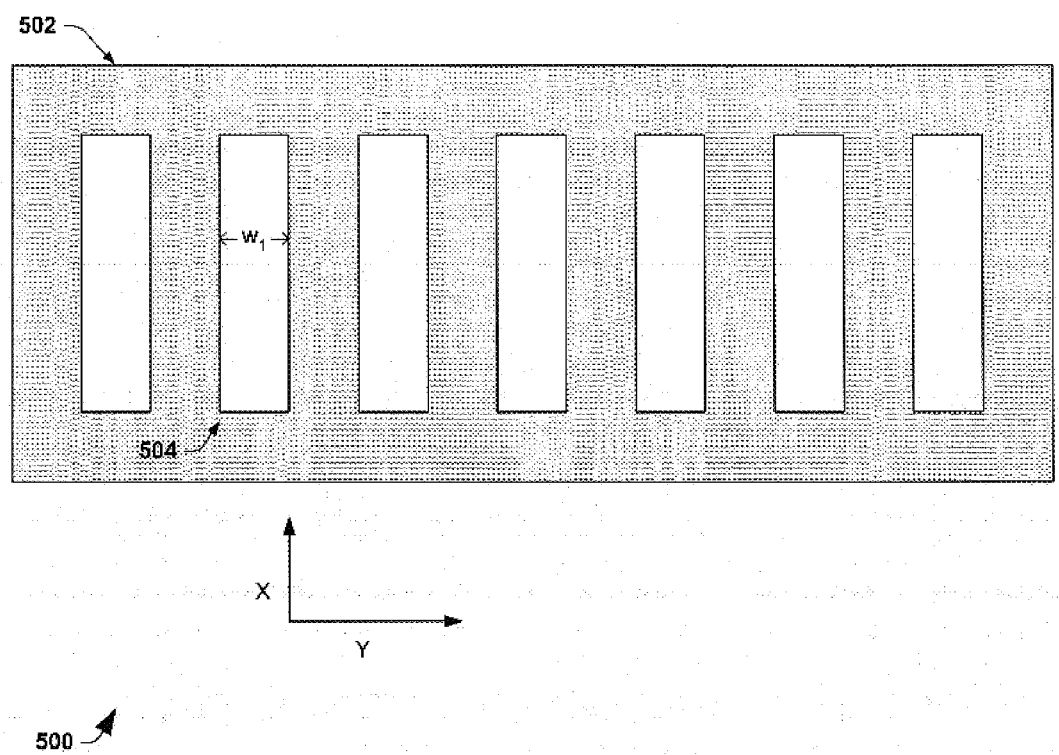
FIG. 5 is a plan view illustrating a configuration for a uniformity detector in accordance with an aspect of the present invention.

Turning now to FIG. 5, a plan view illustrating a configuration 500 of a uniformity detector in accordance with an aspect of the present invention is shown. The configuration 500 is suitable for a single layered uniformity detector such as described with respect to FIG. 2.

The configuration 500 depicts a mask 502 and a series of apertures 504 for a series of elements. The apertures 504 have a defined width we that selectively obtains a beamlet from an ion beam. Pairs of sensors below the aperture(s) are employed to obtain angle of incidence measurements along the "y" direction.

Figure 6:
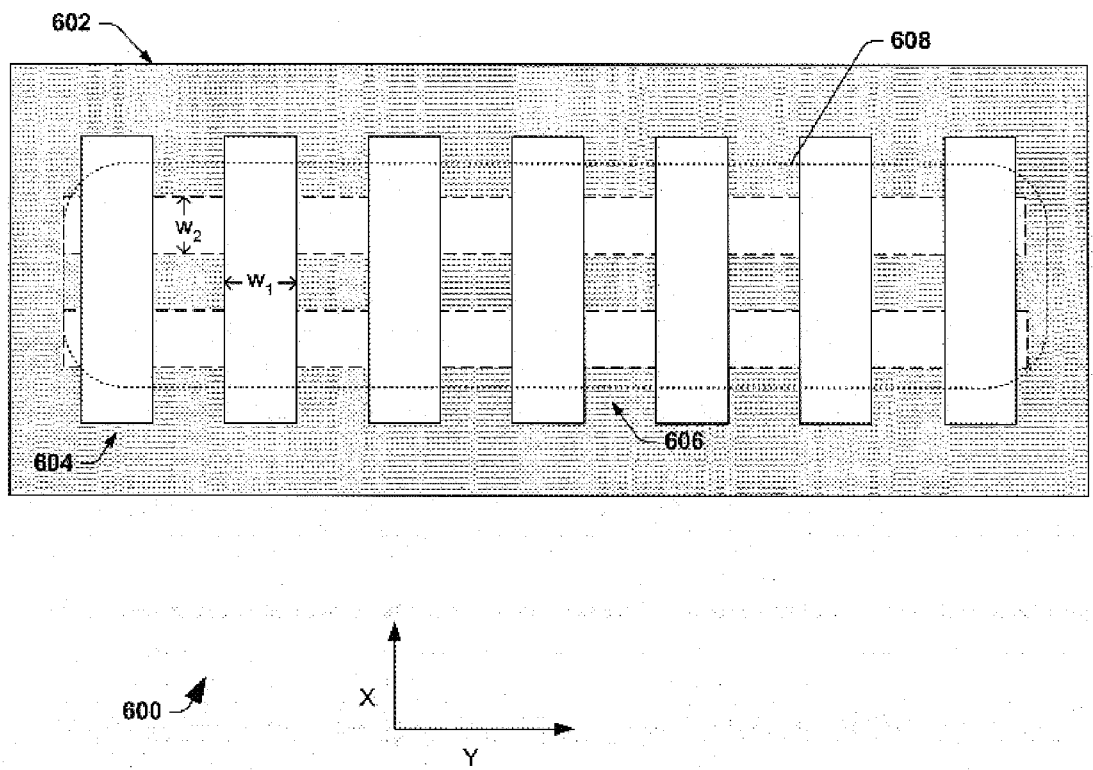
FIG. 6 is a plan view illustrating a configuration for a uniformity detector in accordance with an aspect of the present invention.

Continuing with FIG. 6, another plan view illustrating a configuration 600 of a uniformity detector in accordance with an aspect of the present invention is depicted. The configuration 600 is suitable for a two layered uniformity detector such as described with respect to FIG. 3 and FIG. 4.

The configuration 600 depicts a mask 602 and a series of apertures 604 for a first series of elements. The apertures 604 have a defined width we that selectively obtains a beamlet from an ion beam. Pairs of sensors (not shown) below the aperture(s) are employed to obtain angle of incidence measurements in the "y" direction. Additionally, a second mask (not shown) but below the mask 602 includes a second series of apertures 606 for a second series of elements. The apertures 606 have a defined width $w_2$ that selectively obtains a second beamlet from the ion beam. Second pairs of sensors (not shown) below the apertures 606 are used to obtain angle of incidence measurements in the "x" direction, which in this configuration is shown to be orthogonal or perpendicular to the "y" direction. An exemplary ribbon ion beam, measurable by this uniformity detector 600, is indicated by the rectangular region 608. Accordingly, this configuration 600 permits obtaining angle of incidence measurements at various locations of the ion beam in both the "x" and "y" directions.

It is appreciated that this view is provided to further illustrate the present invention and is not necessarily to scale. Additionally, the number and sizes of the apertures present can vary greatly in implementations of the invention. An exemplary implementation that generally follows FIG. 6 follows. A ribbon ion beam is elongated in the "y" direction and is about 30 cm by 5 cm. An exemplary uniformity detector, also elongated in the "y" direction is about 35 cm by 10 cm. In the "x" direction or axis, the apertures are short and oriented on the "y" direction or axis. In this example, 48 apertures or slots 10 cm long and spaced 0.62 cm apart are lined up along the "y" direction with 48 pairs of sensors behind them. In the orthogonal direction "x", 18 apertures or slots 30 cm long and spaced 0.55 cm apart are arranged with 18 pairs of sensors behind them.

Figure 7:
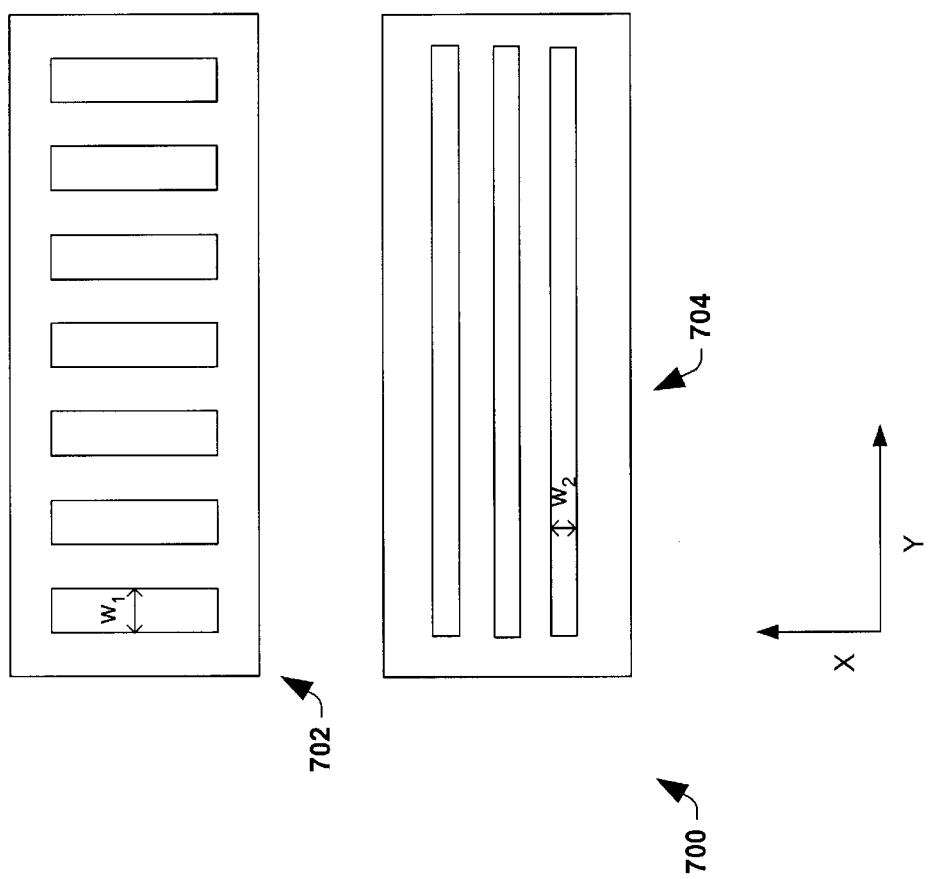
FIG. 7 is a plan view illustrating a configuration for a uniformity detector in accordance with an aspect of the present invention.

FIG. 7 is a plan view illustrating a configuration 700 of a uniformity detector in accordance with an aspect of the present invention. In this configuration 700, a first mask 702 is shown with apertures for a first direction and a second mask 704 is shown with apertures for a second direction (e.g., x). The configuration 700 is similar to that of FIG. 6 in that it facilitates obtaining angle of incidence measurements in both the "x" and "y" directions. However, the second mask 704 is not necessarily located below a first series of elements and the first mask 702.

The apertures of the first mask 702 have a defined width $w_1$ that selectively obtains a first beamlet from an ion beam. Pairs of sensors (not shown) below the aperture(s) are employed to obtain angle of incidence measurements in the "y" direction. The apertures of the second mask 704 has a defined width $w_2$ that selectively obtains a second beamlet from the ion beam, instead of the first beamlet. Second pairs of sensors (not shown) below the apertures of the second mask 704 are used to obtain angle of incidence measurements in the "x" direction, which in this configuration is shown to be orthogonal or perpendicular to the "y" direction. Accordingly, this configuration 700 permits obtaining angle of incidence measurements at various locations of an ion beam in both the "x" and "y" directions.

Figure 8:
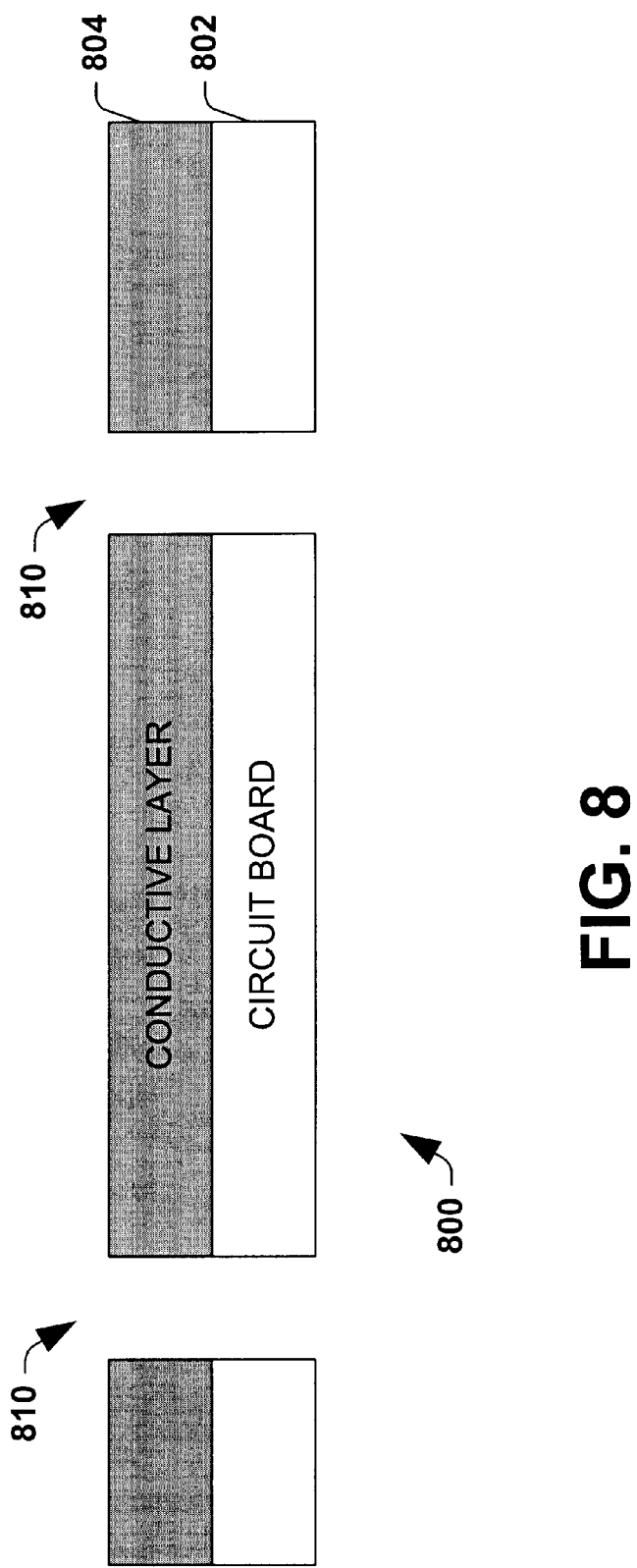
FIG. 8 is a block diagram illustrating an exemplary sensor in accordance with an aspect of the present invention.

FIG. 8 is a block diagram that depicts an exemplary sensor 800 in accordance with an aspect of the present invention. The sensor 800 can be employed to measure beam current and angles of incidence for incoming ion beams as described supra. It is appreciated that other suitable beam sensors can be employed in accordance with the present invention.

A first conductive layer 804 is formed on a circuit board 802 or other suitable substrate. The first conductive layer is comprised of a conductive material such as copper or aluminum. The conductive layer 804 is operable to receive incoming ions from an ion beam or beamlet that build up charge on the circuit board 802. The charge build up is proportional to the amount of ions or beam current of the ion beam and thus can provide an indication or measurement of beam current. One or more gaps 810 are present in the sensor 800 to isolate individual sensor elements and permit portions of an ion beam to pass to an underlying layer.

Figure 9:
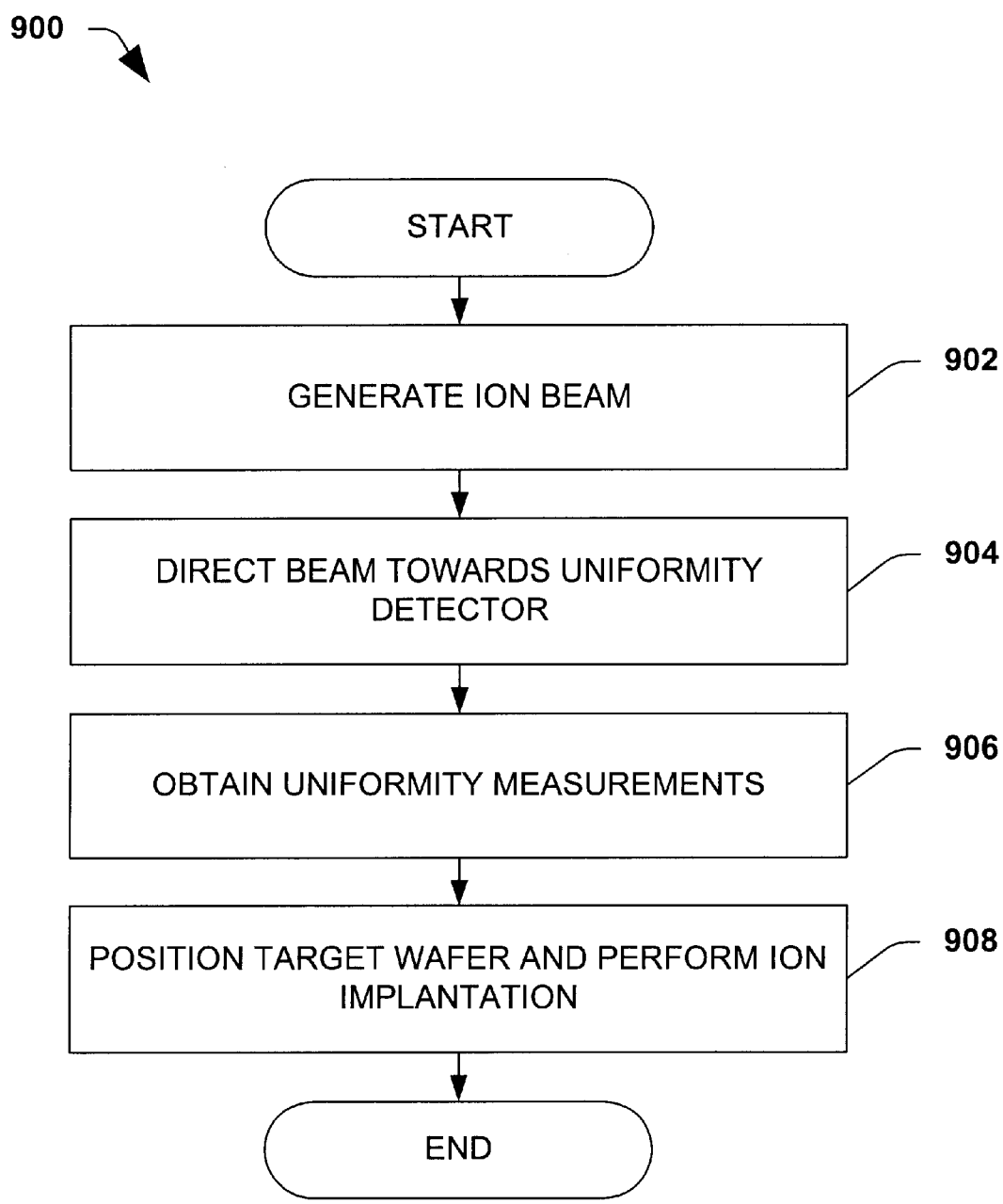
FIG. 9 is a flow diagram illustrating a method of performing a substantially uniform ion implantation in accordance with an aspect of the present invention.
Figure 10:
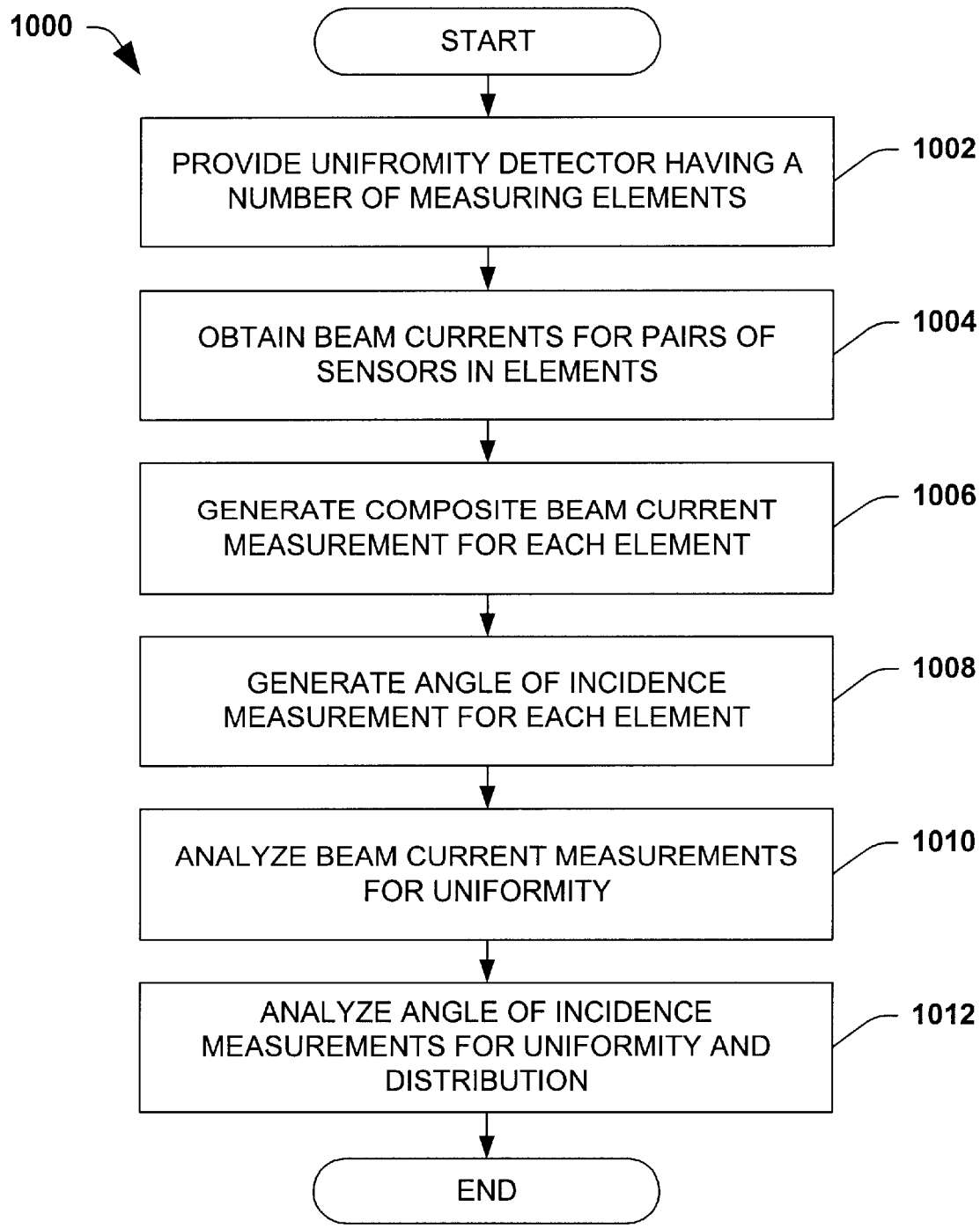
FIG. 10 is a flow diagram illustrating a method of monitoring uniformity of an ion beam in accordance with an aspect of the present invention.

In view of the foregoing structural and functional features described supra and infra, methodologies in accordance with various aspects of the present invention will be better appreciated with reference to FIGS. 9–10. While, for purposes of simplicity of explanation, the methodologies of FIGS. 9–10 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 9, a flow diagram illustrating a method 900 of performing an ion implantation in accordance with an aspect of the present invention is illustrated. The method 900 monitors and adjusts uniformity of the ion beam before and after implantation to improve and/or verify uniformity during the implantation process.

The method 900 begins at block 902 where an ion beam is generated with a number of characteristics including, but not limited to, desired beam current, desired beam current uniformity, angle of incidence, and angle uniformity. Other characteristics of the beam include dose, dopant type, and the like. At block 904, the ion beam is directed at a uniformity detector, which is generally located adjacent to a target wafer. The uniformity detector includes a series of elements that can measure beam current and angle of incidence in one or more directions. Suitable configurations for the uniformity detector are described supra.

The uniformity detector measures angle of incidence uniformity and beam current uniformity of the ion beam at block 906 and corrections on the ion beam can be performed if required. The obtained measurements can be compared to expected values of beam current and angle of incidence to determine if they are appropriate or suitable. Additionally, the measurements are analyzed for uniformity and distribution. Corrections of the ion beam can be accomplished by adjusting one or more parameters and/or components of the ion beam generator (e.g., linear accelerator, mass analyzer, ion source extraction, and the like).

Continuing at block 908, ion implantation is performed on the target wafer. Generally, the target wafer is moved or positioned over the uniformity detector prior to commencement of the ion implantation on the wafer. Additionally, the target wafer is controllably moved through the ion beam to achieve desired implantation properties (e.g., dopant concentration, implant depth, and the like). Subsequent to the ion implantation, the uniformity detector again measures angle of incidence uniformity and beam current uniformity to verify if the ion beam remained uniform through the ion implantation.

FIG. 10 is a flow diagram depicting a method 1000 of monitoring uniformity of an ion beam in accordance with an aspect of the present invention. The method 1000 is operable to measure and analyze beam current and angular uniformity throughout the length of an ion beam.

The method 1000 begins at block 1002 wherein a uniformity detector having a number of measuring elements is provided. Each element of the detector is comprised of an aperture that defines a width of an obtained beamlet and a pair of sensors. Individual beam current measurements are obtained for each pair of sensors at block 1004. A composite beam current measurement is generated from the measured beam currents at block 1006 for each element. Generally, the composite beam current measurement is a sum of the measured beam current of each sensor in the element, however other suitable mechanisms can be employed to yield a composite beam current measurement.

Subsequently, an angle of incidence measurement is generated from the measured beam currents at block 1008 for each element. The angle of incidence measurement is also a function of the individual measured beam currents. A suitable exemplary formula for obtaining the angle of incidence measurement is described supra with respect to Eq. 1.

Continuing, the composite beam current measurements (one for each element) are analyzed for uniformity at block 1010. Typically, a suitable threshold amount or level of deviation is permitted. Deviations or variations of currents beyond that threshold amount are considered unacceptable and require corrective action. Similarly, the angle of incidence measurements (one for each element) are analyzed for uniformity and/or angular distribution at block 1012. Again, a suitable threshold amount of deviation is permitted for the angular distribution. Unacceptable variations require corrective action.

FIGS. 11–15 described below are provided to illustrate an exemplary, suitable uniformity detector in accordance with the present invention. It is appreciated that variations of this detector as well as other suitable uniformity detectors that are operable to obtain angle of incidence measurements can be utilized in accordance with the present invention.

Figure 11:
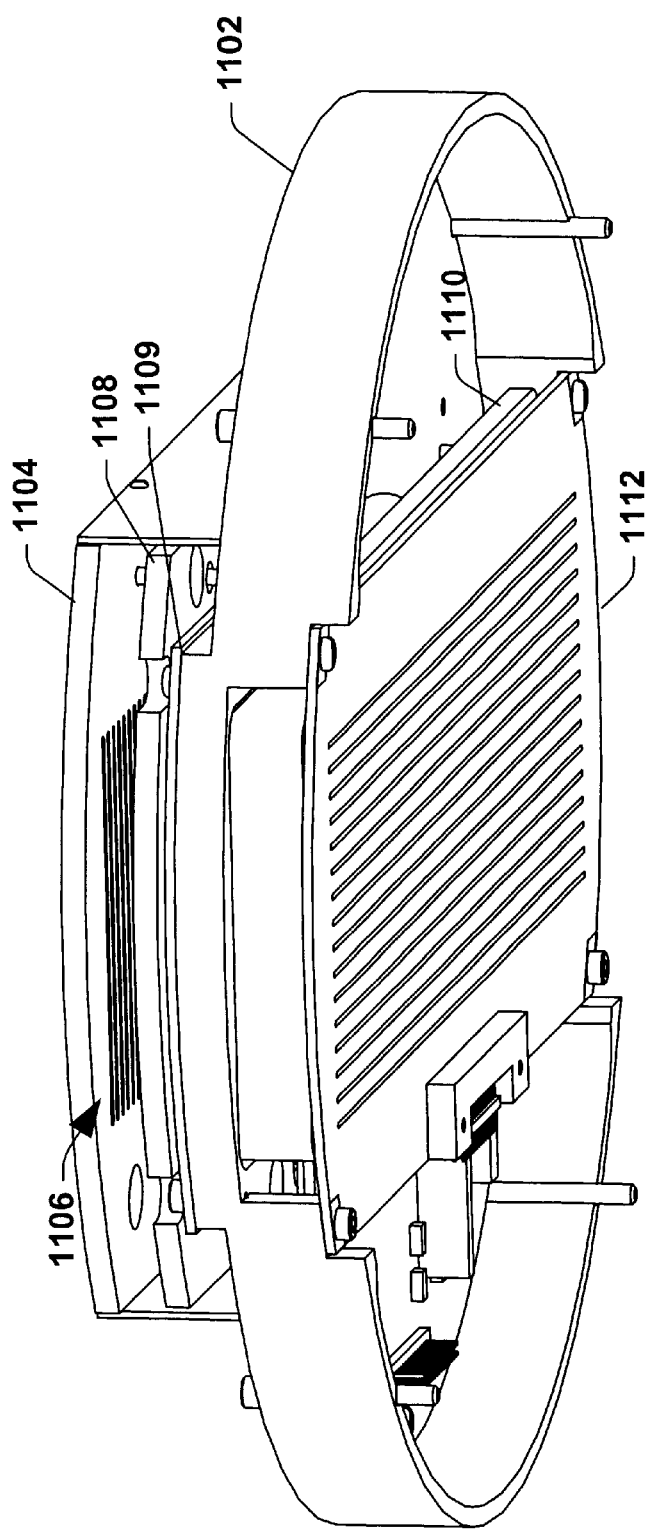
FIG. 11 is a perspective view illustrating a uniformity detector in accordance with an aspect of the present invention.

Beginning with FIG. 11, a perspective view illustrating a uniformity detector 1100 in accordance with an aspect of the present invention is provided. The uniformity detector 1100 comprises two layers that can obtain angle of incidence measurements in first and second directions at various locations. In addition to the angle of incidence measurements, the uniformity detector 1100 is also operable to obtain beam current measurements at the various locations.

A housing 1 102 provides general support and structure for the detector 1100. A first mask 1104 is positioned at a top of the detector 1100. A number of rectangular shaped apertures 1106 are shown formed in the first mask. The apertures 1106 are operative to receive an incoming ion beam and selectively pass a number of beamlets according to a desired width and the rectangular shape as described supra. A suppression layer 1108 is located below the mask 1104 and serves to inhibit electron current to or from sensors. The suppression layer 1108 can improve accuracy of measurements. A first circuit board 1109 is positioned below the suppression layer 1108 a selected distance. The first circuit board 1109 contains a number of sensors that obtain beam current measurements as described supra and can contain circuitry for controlling and analyzing beam current measured by the sensors. This circuitry can determine angle of incidence and beam current from the sensor measurements. Generally, a pair of sensors are provided that correspond to each aperture of the mask 1104. Operation of the pairs of sensors are described in detail supra, but are omitted for brevity here. The pairs of sensors facilitate obtaining angle of incidence measurements in the first direction.

A second mask 1110 is positioned below the circuit board 1109 and contains a number of apertures (not shown) that are orthogonal to those contained in the first mask 1104. These apertures are rectangular shaped with a specific width and selectively obtain second beamlets from portions of the ion beam that pass through gaps in the first circuit board 1109. A suppression layer is not employed for the second layer, but can be used in other variations and aspects of the present invention. A second circuit board 1112 is positioned a selected distance below the second mask and also contains pairs of beam current sensors that facilitate obtaining angle of incidence measurements in the second direction. Additionally, the second circuit board 1112 can optionally contain circuitry for controlling and analyzing beam current measured by the sensors.

Although not shown, the uniformity detector can also contain circuitry for organizing and reporting the measured information, which can be reported to a control system (e.g., processor based control system) that can further analyze the obtained measurements, store obtained measurements, compare obtained measurements to expected measurements, and the like.

Figure 12:
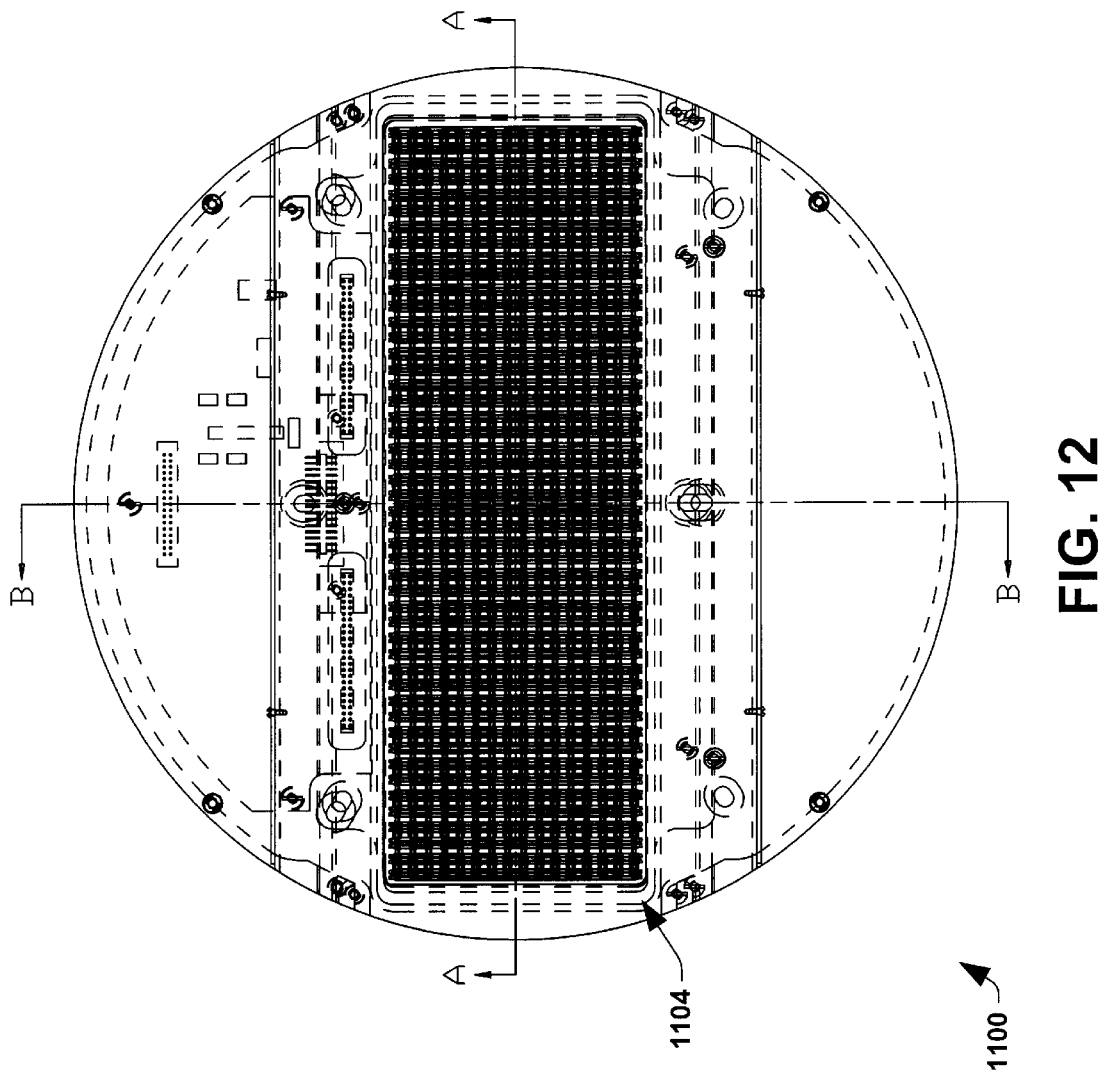
FIG. 12 is a top view illustrating a uniformity detector in accordance with an aspect of the present invention.

Continuing on with FIG. 12, a top view of the uniformity detector 1100 in accordance with an aspect of the present invention is depicted. The top view illustrates a general shape of the detector 1110 and illustrates a configuration of the first layer mask 1104. Cut lines A—A and B—B are also shown for FIG. 13 and FIG. 14, respectively.

Figure 13:
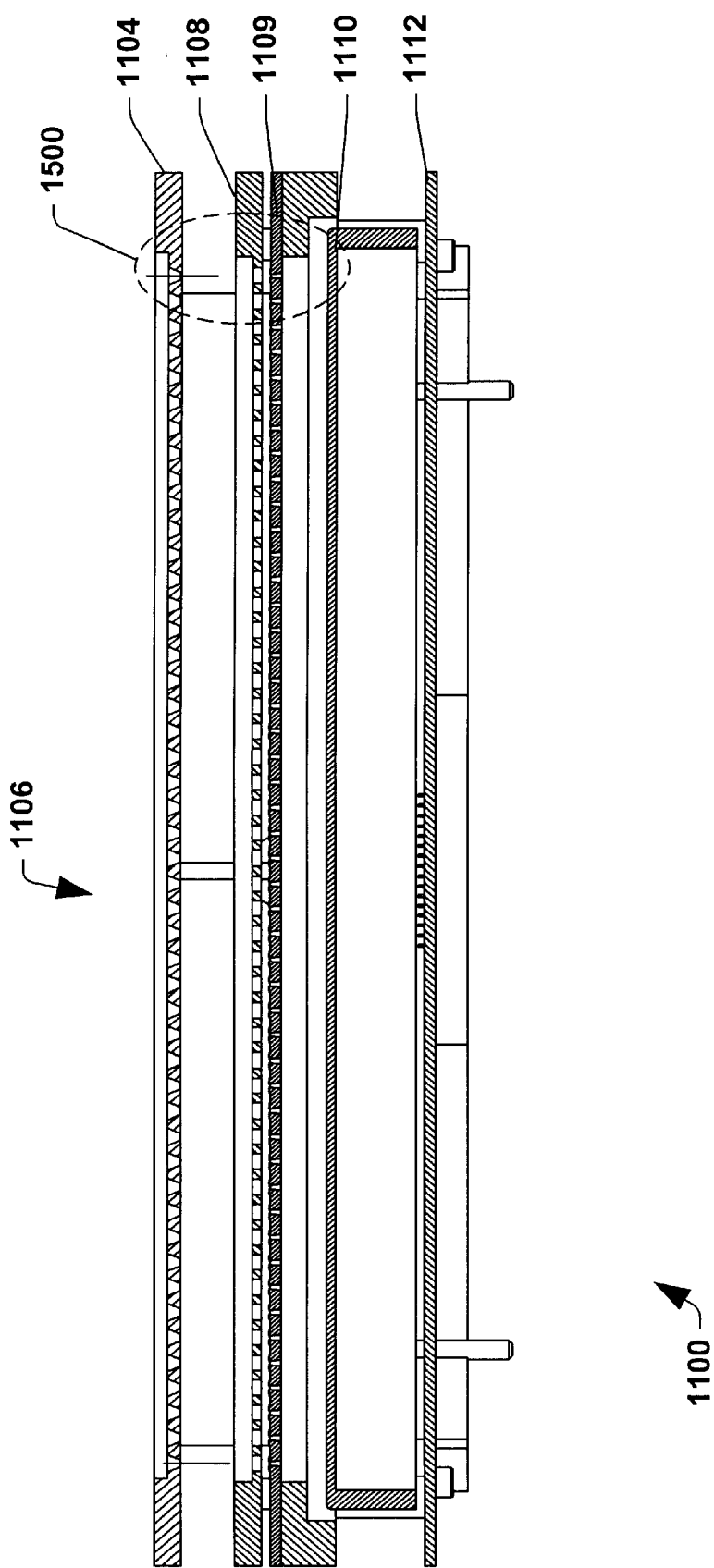
FIG. 13 is a cross section view illustrating a uniformity detector in accordance with an aspect of the present invention.

FIG. 13 is a cross section view illustrating the uniformity detector 1100 in accordance with an aspect of the present invention along the A—A line of FIG. 12. The first layer mask 1104 is positioned at the top of the detector and includes the apertures 1106. From this cross section, individual apertures can be seen. The suppression layer 1108 is positioned below the first layer mask 1104. Continuing on, the first circuit board 1109, which contains the pairs of sensors, is positioned the selected distance (e.g., $g_1$) below the first layer mask. The second layer mask 1110 is positioned below the circuit board 1109. The second circuit board 1112 is also the selected distance (e.g., $g_2$) below the second layer mask 1110. A detail region 1500 is indicated in FIG. 13 and is further described with respect to FIG. 15.

Figure 14:
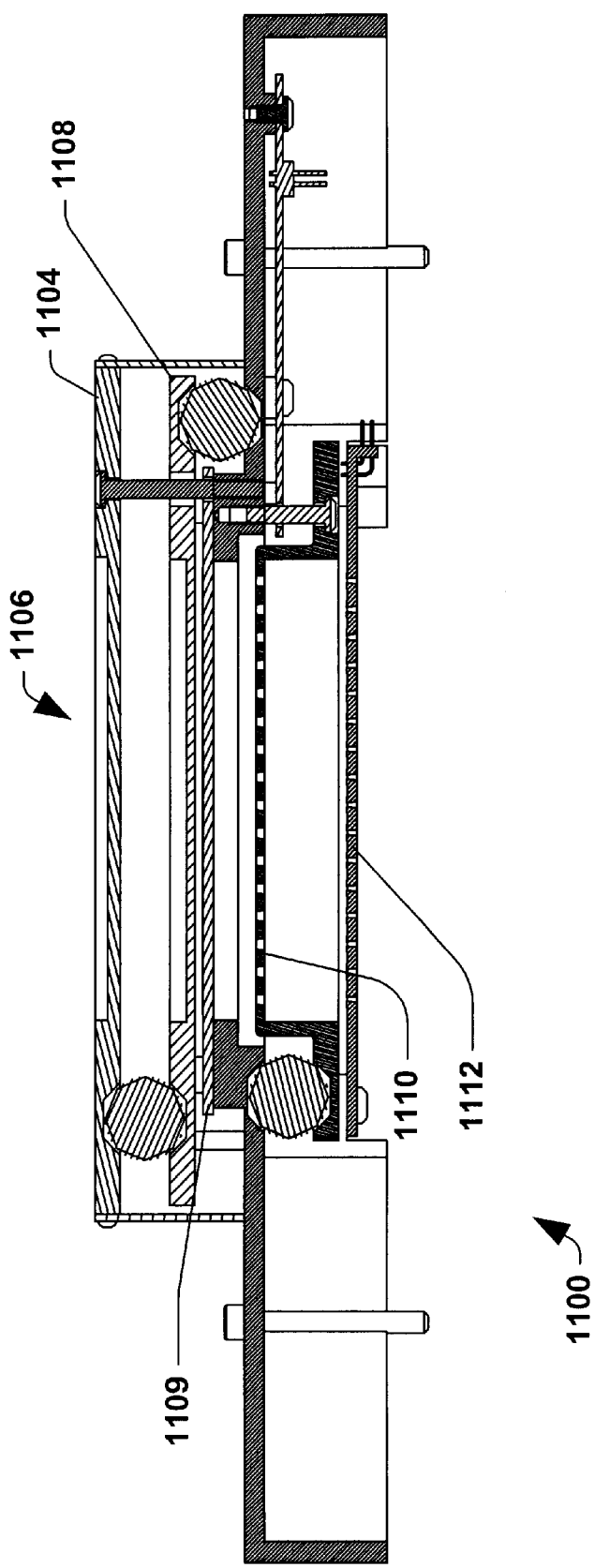
FIG. 14 is another cross section view illustrating a uniformity detector in accordance with an aspect of the present invention.

FIG. 14 is another cross sectional view illustrating the uniformity detector 1100 in accordance with an aspect of the present invention along the B—B line of FIG. 12. The view presented in FIG. 14 is similar to that presented in FIG. 13, but is orthogonal to that view of FIG. 13. As a result, individual apertures in the second layer mask 1110 are visible and are not visible in the first layer mask 1104.

Figure 15:
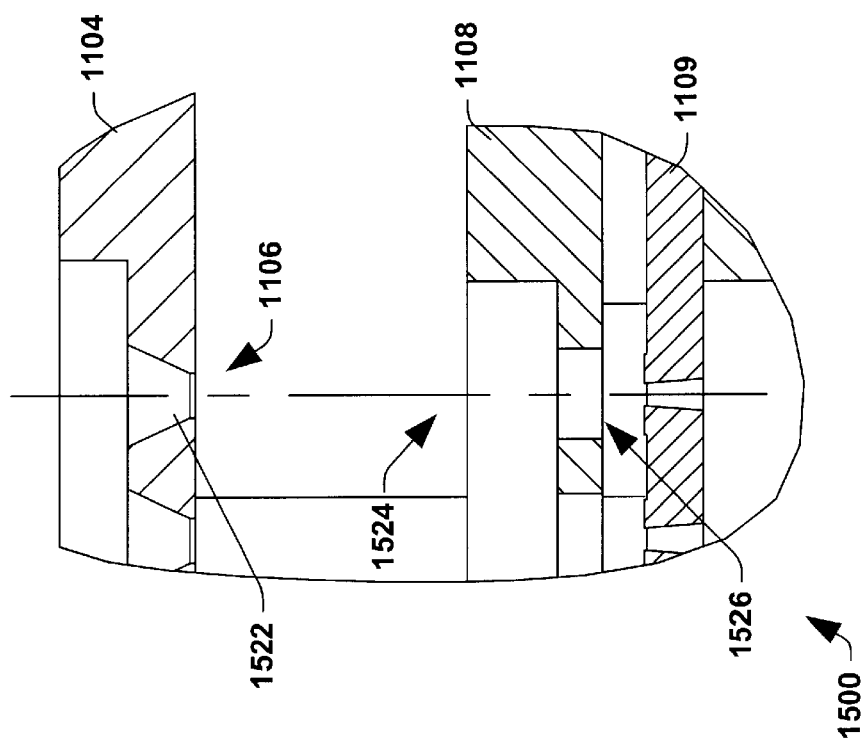
FIG. 15 is a detail view illustrating a portion of a uniformity detector in accordance with an aspect of the present invention.

FIG. 15 is a close up view 1500 illustrating the uniformity detector 1100 in accordance with an aspect of the present invention. The view 1500 is a close up view of the region indicated in FIG. 13. The first layer mask 1104 is shown with the apertures 1106 shown in greater detail. The apertures 1106 are depicted with a trapezoidal like shape 1522. It is appreciated that the present invention is not limited to only trapezoidal shaped apertures, but can include other sized/shaped apertures. The suppression layer 1108 is depicted in greater detail to show openings 1524 through which the beamlets can pass. These openings 1524 are not intended to limit or select passage of ions through the beamlets and are wide enough so as to not interfere with the beamlets. The first circuit board 1109 is shown positioned below the suppression layer. Gaps 1526 in the circuit board 1109 can be seen which serve to isolate the sensors within the first circuit board 1109 and to permit some ions or a portion of the ion beam to pass through to the second mask 1110 (not shown in FIG. 15).

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A beam uniformity measurement system comprising:
    an aperture that selectively obtains a beamlet from an ion beam;
    a first beam current sensor positioned below the aperture that obtains a first beam current measurement of the beamlet; and
    a second beam current sensor positioned below the aperture and adjacent to the first beam current sensor that obtains a second beam current measurement of the beamlet, wherein the first beam current measurement and the second beam current measurement yield information relating to an angle of incidence of the ion beam.

2. The system of claim 1, wherein the first beam current sensor and the second beam current sensor are positioned a distance below the aperture.

3. The system of claim 2, wherein the aperture has a selected width that defines a width of the beamlet.

4. The system of claim 3, wherein the angle of incidence is a function of the first beam current measurement, the second beam current measurement, the distance below the aperture, and the width of the aperture.

5. The system of claim 4, wherein the angle of incidence is obtained by the following formula:

$$A=((S1-S2)/(S1+S2))*w/2g;$$

wherein A is the angle of incidence, S1 is the first beam current measurement, S2 is the second beam current measurement, w is the width of the aperture, and g is the distance below the aperture.

6. The system of claim 1, wherein the aperture is defined by a slit in a mask.

7. The system of claim 6, wherein the mask is comprised of graphite.

8. The system of claim 1, wherein the first sensor and the second sensor are comprised of:
    a conductive layer on a top surface that is operable to be struck by ions of the beamlet and buildup a charge on a suitable substrate.

9. A beam uniformity measurement system comprising:
    a first series of elements arranged along a first direction, wherein the first series of elements obtain angle of incidence measurements of an ion beam along the first direction; and
    a second series of elements arranged in a second direction, wherein the second series of elements obtain angle of incident measurement of the ion beam along the second direction.

10. The system of claim 9, wherein the ion beam is a ribbon beam.

11. The system of claim 10, wherein a wide portion of the ribbon beam is along the first direction.

12. The system of claim 9, wherein the second direction is orthogonal to the first direction.

13. The system of claim 9, wherein the first series of elements and the second series of elements are further operable to obtain beam current measurements.

14. The system of claim 9, wherein the second series of elements is located below the first series of elements.

15. The system of claim 9, wherein the respective elements of the first series of elements comprise:
    an aperture that selectively obtains a beamlet from an ion beam;
    a first beam current sensor positioned below the aperture that obtains a first beam current measurement of the beamlet; and
    a second beam current sensor positioned below the aperture and adjacent to the first beam current sensor that obtains a second beam current measurement of the beamlet, wherein the first beam current measurement and the second beam current measurement yield information relating to an angle of incidence of the ion beam.

16. The system of claim 9, wherein the first series of elements obtain beamlets having a first width from the ion beam and the second series of elements obtain beamlets having a second width from the ion beam.

17. A method of monitoring uniformity of an ion beam comprising:

generating an ion beam according to a desired angle of incidence and a desired angle of incidence uniformity;

directing the ion beam towards a uniformity detector;

obtaining a number of angle of incidence measurements throughout the ion beam by the uniformity detector;

analyzing the number of angle of incidence measurements for uniformity; and on non-uniformity, modifying generation of the ion beam according to the measured non-uniformity.

18. The method of claim 17, wherein generating the ion beam further comprises generating the ion beam according to a desired beam current and a desired beam current uniformity.

19. The method of claim 18, further comprising obtaining a number of beam current measurements throughout the ion beam by the uniformity detector.

20. The method of claim 17, wherein the uniformity detector is positioned adjacent to a target wafer.

21. The method of claim 20, further comprising moving the target wafer through the ion beam at a selected rate to perform ion implantation.

22. The method of claim 17, wherein the uniformity detector comprises a number of elements that obtain the number of angle of incidence measurements in a first direction.

* * * * *

UNITED STATES PATENT AND TRADEMARK OFFICE
CERTIFICATE OF CORRECTION

PATENT NO. : 6,677,598 B1  Page 1 of 1
DATED : January 13, 2004
INVENTOR(S) : Victor M. Benveniste It is certified that error appears in the above-identified patent and that said Letters Patent is hereby corrected as shown below:

<u>Column 7,</u>
Lines 27 and 39, please replace the word "we" with the label -- $w_1$ --.

Signed and Sealed this

Sixteenth Day of March, 2004

JON W. DUDAS
*Acting Director of the United States Patent and Trademark Office*